United States Patent [19]

Kaneda et al.

[11] Patent Number: 5,302,852
[45] Date of Patent: Apr. 12, 1994

[54] SEMICONDUCTOR DEVICE PACKAGE HAVING A LOW PROFILE STRUCTURE AND HIGH STRENGTH

[75] Inventors: Kenichi Kaneda; Akio Tanda, both of Tokyo, Japan

[73] Assignee: NEC Corporation, Tokyo, Japan

[21] Appl. No.: 21,318

[22] Filed: Feb. 23, 1993

[30] Foreign Application Priority Data

Feb. 27, 1992 [JP] Japan .................. 4-039957

[51] Int. Cl.[5] .................. H01L 23/02; H01L 23/12
[52] U.S. Cl. .................. 257/704; 257/710; 257/701
[58] Field of Search ............... 257/701, 702, 703, 704, 257/679, 681, 680, 710, 711

[56] References Cited

U.S. PATENT DOCUMENTS 5,063,435 11/1991 Okamoto et al. .................. 257/677
5,159,432 10/1992 Ohkubo et al. .................. 257/702

FOREIGN PATENT DOCUMENTS 61-194750  8/1986 Japan .................. 257/710
1-160860 11/1989 Japan .
2-96739   8/1990 Japan .
3-48446   3/1991 Japan .................. 257/710
4-6857    6/1992 Japan .

*Primary Examiner*—Rolf Hille
*Assistant Examiner*—S. V. Clark
*Attorney, Agent, or Firm*—Whitham & Marhoefer

[57] ABSTRACT

A semiconductor device includes a semiconductor element, a base, a cap, leads, and low-melting glass. The semiconductor element is mounted on the base, and the base consists of high-purity alumina and has a thickness of 0.5 mm or less. The cap is arranged on the base to cover the semiconductor element, consists of translucent alumina, and has a thickness of 0.4 mm or less. The leads extend out of the semiconductor device to be interposed between the base and the cap, and are electrically connected to the semiconductor element. The low-melting glass integrally and hermetically seals the base, the leads, and the cap.

7 Claims, 4 Drawing Sheets

SEMICONDUCTOR DEVICE PACKAGE HAVING A LOW PROFILE STRUCTURE AND HIGH STRENGTH

BACKGROUND OF THE INVENTION

The present invention relates to a semiconductor device having a low-profile structure and mainly used in a memory card, an IC card, or the like.

In recent years, a semiconductor device having a low-profile structure is being strongly demanded to be mounted in a memory card, an IC card, or the like. FIG. 4 shows a conventional semiconductor device of this type. A UVEPROM (an ultraviolet erasable read only memory) semiconductor element 206 is fixed on a black alumina base 202 having a recessed portion 210 with a brazing material 207 such as a glass Ag paste or an Al paste, and the electrodes (not shown) of the semiconductor element 206 are connected to leads 203 through wiring lines 208. The resultant structure is covered with a translucent alumina cap 201, and is hermetically sealed with low-melting glass 204, thereby obtaining a package body having a thickness of 1.3 to 1.5 mm (Japanese Utility Model Laid-Open No. 1-160860). In addition, as another conventional example, there is a semiconductor device in which grooves 209 are formed in the sealing surface of a translucent alumina cap 201 as shown in FIG. 5, or the sealing surface of the translucent cap 201 is roughened. In this example, the contact area between the translucent alumina cap 201 and low-melting glass 204 is increased to improve the bonding strength between the cap and the low-melting glass, thereby improving the package strength (Japanese Utility Model Laid-Open No. 2-96739). As still another conventional example, there is a semiconductor device whose sealing portion is improved. This example is shown in FIG. 6. In this example, a layer consisting of a refractory glass layer 205 is formed at a boundary portion between a translucent alumina cap 201 and low-melting glass 204. The refractory glass 205 is screen-printed on the translucent alumina cap 201, and is sintered at a high temperature. When the glass is treated at a high temperature, since the glass sufficiently conforms to the recessed and projection portions of the surface of a ceramic material, a high bonding strength between the translucent alumina cap 201 and the refractory glass 205 can be obtained. Since the refractory glass 205 and the low-melting glass 204 consist of glass materials, the refractory glass 205 tends to be properly mixed with the low-melting glass 204, and a sufficient bonding strength can be obtained (Japanese Patent Laid-Open No. 4-6857).

As has been described above, a conventional semiconductor device whose package body has a thickness of 1.3 to 1.5 mm and a high bonding strength between the translucent alumina cap 201 and the low-melting glass 204 is known.

When the thickness of a package body is decreased to 1.3 mm or less by using the prior art, three problems, i.e., base cracking, base peeling, and cap cracking are posed.

Since the thin package body has a low mechanical strength not to withstand an external force, these problems are posed. Especially, the pressure (generally, 4 to 6 kgf/cm$^2$) of a helium gas prior to a hermeticity test uniquely performed for a hermetic sealed package is the largest external force acting on the package and often breaking the package. This phenomenon occurs because of the following reasons. That is, when the package is pressed at a high pressure around the package during the pressurization of helium, as shown in FIG. 7, the central portions of the cap and base are recessed. This deformation causes the bottom portion of the base, the boundary portion between the base and the low-melting glass, the upper portion of the cap, and the boundary portion between the cap and the low-melting glass to generate high stresses, as indicated by arrows A, B, C, and D in FIG. 7, respectively. Base cracking, base peeling, cap cracking, and cap peeling occur at the bottom portion of the base, the boundary portion between the base and the low-melting glass, the upper portion of the cap, and the boundary portion between the cap and the low-melting glass, respectively.

On the other hand, the package strength of the above four portions of the conventional UVEPROM semiconductor device is very low except for the boundary portion between the cap and the low-melting glass upon the above counter measure.

First, the base portion has the following drawbacks:

Since the base portion has a recessed shape, the central portion having a small thickness has a low strength.

Since black alumina serving as the material of the base contains $Al_2O_3$ having a low purity of 90 to 92% and contains a glass component such as $SiO_2$ and MgO having low strength, the glass portion is easily broken first, thereby degrading the strength of the base.

Second, the boundary portion between the base and the low-melting glass has the following drawback:

When the thickness of the base is decreased, the deformation amount of the base is increased to increase a load on the boundary portion. However, since a countermeasure for improving the bonding strength between the base and the low-melting glass is not performed, the strength of the boundary portion between the base and the low-melting glass is degraded.

Third, the cap portion has the following drawback:

Translucent alumina serving as the material of the cap has a large grain size of 10 to 30 $\mu$m and an average grain size of 15 $\mu$m, and crystal grain intervals of the translucent alumina are wide. For this reason, the cap has many voids, and cracking easily occurs from the voids, thereby degrading the strength of the cap. As described above, the conventional semiconductor device has the drawbacks at the three portions.

SUMMARY OF THE INVENTION

It is an object of the present invention to provide a semiconductor device having a higher package strength.

It is another object of the present invention to provide a semiconductor device in which a package body is designed to have a small thickness.

In order to achieve the above objects, according to the present invention, there is provided a semiconductor device comprising a semiconductor element, a base on which the semiconductor element is mounted, and which consists of high-purity alumina and has a thickness of not more than 0.5 mm, a cap arranged on the base to cover the semiconductor element, consisting of translucent alumina, and having a thickness of not more than 0.4 mm, leads extending out of the semiconductor device to be interposed between the base and the cap and electrically connected to the semiconductor element, and low-melting glass for integrally and hermetically sealing the base, the leads, and the cap.

DESCRIPTION OF THE PREFERRED EMBODIMENTS

Figure 1:
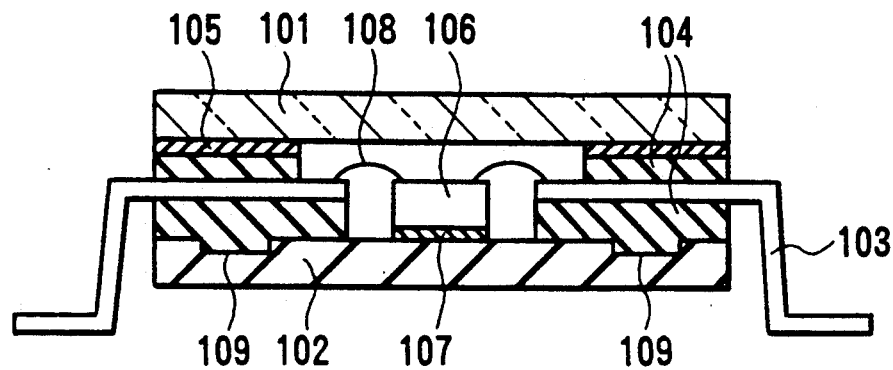
FIG. 1 is a longitudinal sectional view showing a semiconductor device according to the first embodiment of the present invention.

The present invention will be described below with reference to the accompanying drawings. FIG. 1 shows a UVEPROM memory IC as a semiconductor device according to an embodiment of the present invention. A UVEPROM semiconductor element 106 is fixed on a flat high-purity alumina base 102 through a brazing material 107. The electrodes (not shown) of the UVEPROM semiconductor element 106 extend out of the semiconductor device through wiring lines 108 by gull-wing leads 103 bonded at the same level as that of the wiring lines 108. A translucent alumina cap 101 entirely covers the UVEPROM semiconductor element 106, and the high-purity alumina base 102, the leads 103, and the translucent alumina cap 101 are hermetically sealed by a low-melting glass 104. Two grooves 109 are formed in the sealing surface of the high-purity alumina base 102. In addition, refractory glass 105 is formed at the boundary portion between the translucent alumina cap 101 and the low-melting glass 104. In this embodiment, in order to set the thickness of a package body to be, e.g., 1.27 mm, the thicknesses of the UVEPROM semiconductor element 106, the translucent alumina cap 101, the high-purity alumina base 102, and each of the leads 103 are set to be 0.3 mm, 0.25 mm, 0.25 mm, and 0.127 mm, respectively. Note that the thicknesses of the high-purity alumina base 102, the translucent alumina cap 101, and the package body are preferably set to be 0.5 mm or less, 0.4 mm or less, and 1.3 mm or less, respectively.

Figure 3:
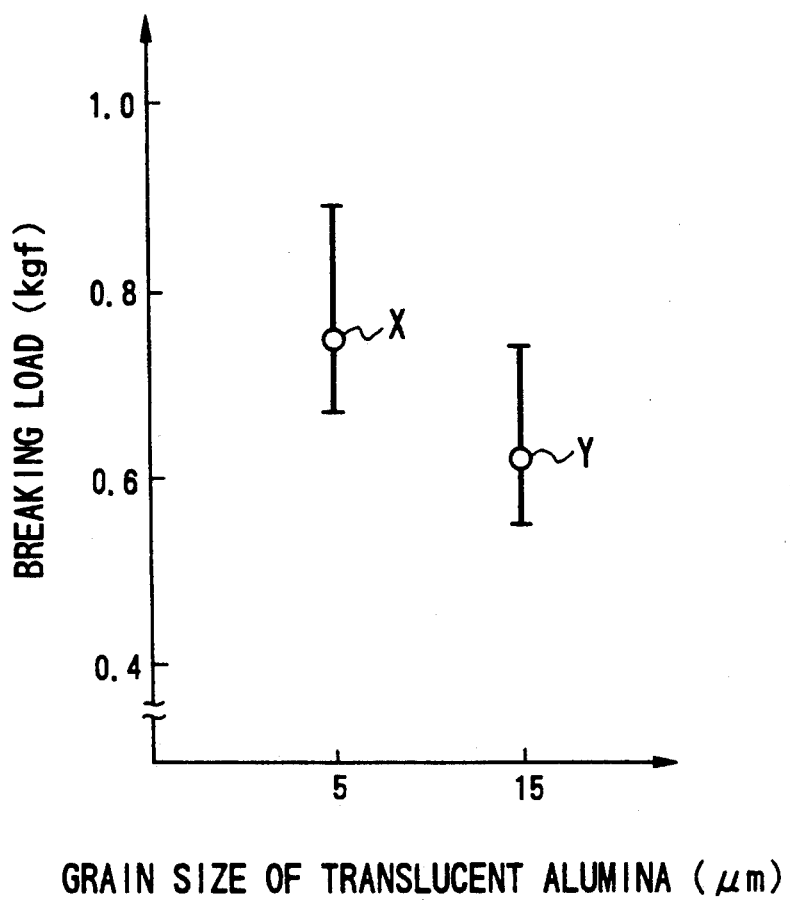
FIG. 3 is a graph wherein the strength of the translucent alumina cap of the present invention and the strength of the translucent alumina cap of the prior art are compared with each other.
Figure 4:
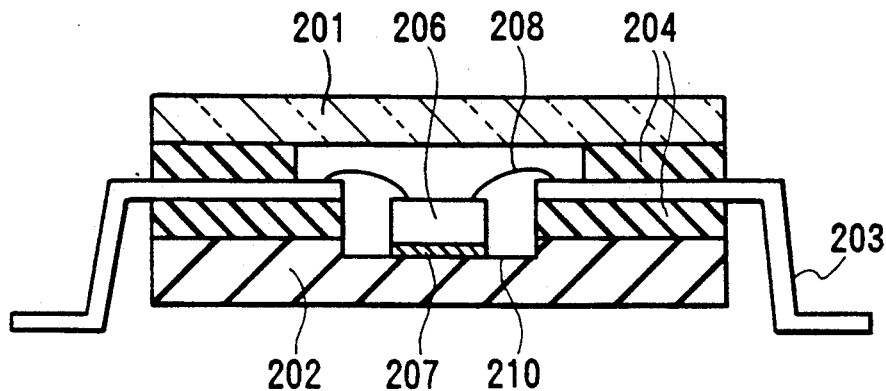
FIGS. 4 to 6 are sectional views showing three types of conventional semiconductor devices, respectively.
Figure 5:
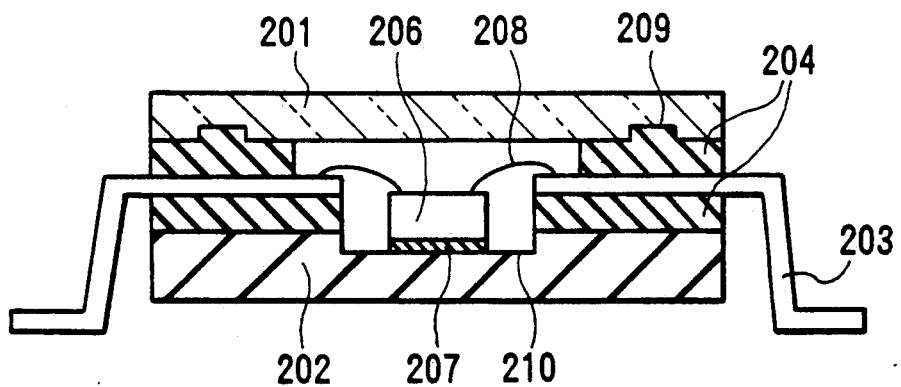

As the material of the high-purity alumina base 102, alumina as $Al_2O_3$ of high purity, i.e., 99.5% is used. The high-purity alumina is high-purity $Al_2O_3$ and rarely contains glass components such as $SiO_2$ and MgO. Since the alumina rarely contains the glass components, the glass components are not easily broken. Since $Al_2O_3$ itself is considerably strong, the high-purity alumina having a material strength of 50[kgf/mm$^2$] is considerably stronger than black alumina having a material strength of 30 [kgf/mm$^2$]. In addition, the flat base is used, the thickness of the central portion of the base is increased, the central portion has the same strength as that of any other portion of the base. As a result, the base strength is considerably increased. In addition, in the sealing portion of the base, the two grooves 109 are formed in the sealing surface of the high-purity alumina base 102 to increase the contact area of the high-purity alumina base 102 and the low-melting glass 104, and the bonding strength between the high-purity alumina base 102 and the low-melting glass 104 is increased. As translucent alumina serving as a cap material, translucent alumina having a small crystal grain size of 10 μm or less and an average grain size of 5 μm is used. When the translucent alumina has a small grain size, it has a dense structure, the number of voids is decreased, and no cracks occur. For this reason, as shown in FIG. 3, the strength of translucent alumina X of this embodiment is increased by 15% compared with that of conventional translucent alumina Y having an average crystal grain size of 15 μm. Note that FIG. 3 shows a relationship between the grain size of translucent alumina and a breaking load of a three-point bending test. The test was performed under the following conditions: the size of test sample was 20 mm ×11.0 mm ×0.18 mm; a three-point bending span distance was 16 mm; a cross head was a steel ball having a diameter of 5 mm; and a speed was 0.5 mm/min. As described above, according to this embodiment, the strength of a portion where a high stress is generated during the pressurization of helium is increased, a low-profile package body having a thickness of 1.3 mm or less can be obtained. When no grooves are formed in the sealing surface of the high-purity alumina base 102, and the sealing surface of the high-purity alumina base 102 is roughened, a high bonding strength can be obtained.

Figure 2:
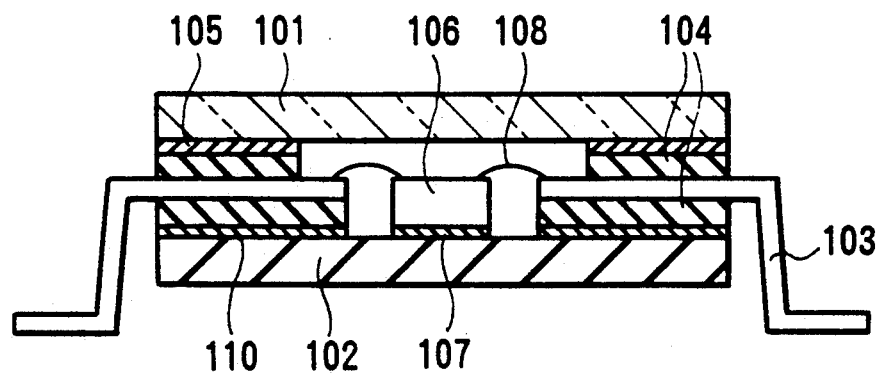
FIG. 2 is a longitudinal sectional view showing a semiconductor device according to the second embodiment of the present invention.

FIG. 2 shows another embodiment of the present invention. The different point between this embodiment and the first embodiment is only that a refractory glass layer 110 is formed at the boundary portion of a low-melting glass 104 and a high-purity alumina base 102 having no grooves, and other arrangements of the second embodiment are the same as those of the first embodiment. According to the second embodiment, the bonding strength between the high-purity alumina base 102 and the low-melting glass 104 is increased by the refractory glass layer 110. The bonding strength between the high-purity alumina base 102 and the low-melting glass 104 which are bonded to each other by the refractory glass according to the second embodiment is higher than the bonding strength between the high-purity alumina base 102 and the low-melting glass 104 which are bonded to each other by forming the grooves according to the first embodiment. When the shearing strength of test samples each obtained by sealing the high-purity alumina base 102 having dimensions of 20 mm ×11 mm ×0.25 mm with the low-melting glass 104 (no low-melting glass is formed at a central portion having dimensions of 13 mm ×8 mm) was measured, the shearing strength of a sample having a sealing surface in which two grooves each having a width of 0.4 mm and a depth of 0.05 mm were formed was 40.8 kgf, and the shearing strength of a sample having the refractory glass layer 110 is considerably increased to, i.e., 56.4 kgf. For this reason, a high package strength can be obtained, and a lower-profile element can be obtained. Note that, in FIG. 2, an Al deposition film may be formed on the sealing surface of the high-purity alumina base in place of the refractory glass layer 110.

Figure 6:
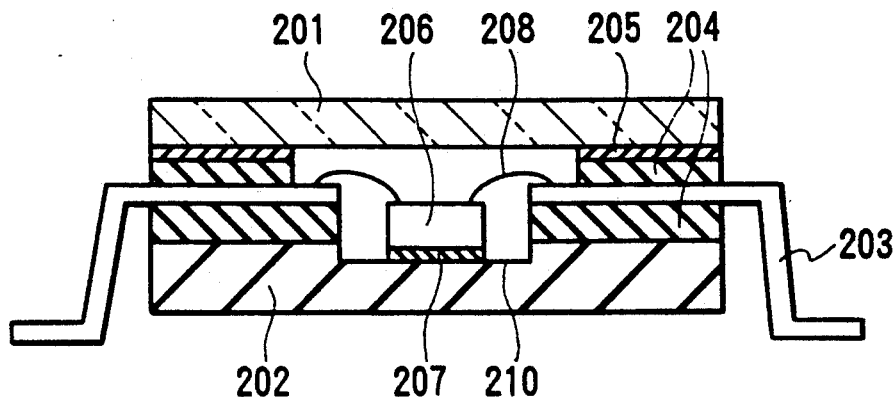
Figure 7:
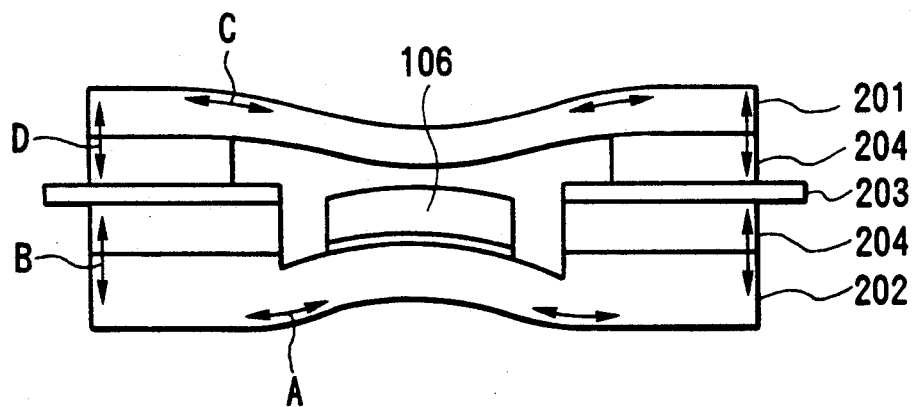
FIG. 7 is a view for explaining a deformation state and a high-stress generation state during pressurization of helium.

As has been described above, according to the present invention, since the strength of a portion where a high stress is generated during the pressurization of helium in a hermeticity test is considerably increased, a low-profile package body having a thickness of 1.3 mm or less can be obtained. Comparison results obtained by evaluating the hermeticity of the conventional structure in FIG. 6 and the structure of the second embodiment in FIG. 2 will be described below. In this evaluation, each sample obtained by mounting a silicon chip having dimensions of 7 mm ×10.5 mm ×0.3 mm on a structure having outer dimensions of 20 mm ×11 mm, a package body thickness of 1.0 mm, a cap layer thickness of 0.25 mm, and a base thickness of 0.25 mm was used. Note that a recessed portion for mounting a 7-mm chip was formed in each sample having the conventional structure. As an evaluation method, when the pressure of a helium gas was gradually increased to, i.e., 3, 4, 5, 6, and 7 kgf/cm$^2$ (each held for one hour), the production rate of samples each having defective hermeticity (a sample having leakage of $1 \times 10^{-8}$ atom·cc/sec or more was regarded as a defective sample) was measured at each pressure.

TABLE

| Helium Pressure kgf/cm$^2$ | 3 | 4 | 5 | 6 | 7 |
| --- | --- | --- | --- | --- | --- |
| Sample of Present Invention | 0/30 | 0/30 | 0/30 | 0/30 | 0/30 |
| Sample Having Conventional Structure | 0/30 | 4/30 | 5/26 | 8/21 | 8/13 |

(each numerical value represents the number of defective samples/the number of test samples)

As a result, as described in the above table, in each of the samples each having the conventional structure, base cracking began to occur at a pressure of 4 kgf/cm$^2$, and cap cracking and base peeling began to occur at 5 kgf/cm$^2$. In contrast to this, in each of the samples of the present invention, any defective hermeticity does not occur even at a pressure of 6 kgf/cm$^2$, and it was found that the sample of the present invention had a very high package strength. In a manufacturing technique at present, since the thicknesses of a high-purity alumina base and a translucent alumina cap are limited to 0.1 mm each, the minimum thickness of a package body is 0.5 mm. Therefore, a combination of the above thicknesses falling within the above limits is preferably selected to obtain a structure having a high strength.

What is claimed is:

1. A semiconductor device comprising:
a semiconductor element;
a flat shaped base on which said semiconductor element is mounted, and which consists of high-purity alumina and has a thickness of not more than 0.5 mm;
a cap arranged on said base to cover said semiconductor element, consisting of translucent alumina, having a crystal grain size of not more than 10 μm, and having a thickness of not more than 0.5 mm;
a cap arranged on said base to cover said semiconductor element, consisting of translucent alumina, having a crystal grain size of not more than 10 μm, and having a thickness of not more than 0.4 mm;
leads extending out of said semiconductor device to be interposed between said base and said cap and electrically connected to said semiconductor element; and
low-melting glass for integrally and hermetically sealing said base, said leads, and said cap, at least one groove being formed in a sealing surface of said base contacting said low-melting glass.

2. A semiconductor device comprising:
a semiconductor element;
a flat shaped base on which said semiconductor element is mounted, and which consists of high-purity alumina and has a thickness of not more than 0.5 mm;
a cap arranged on said base to cover said semiconductor element, consisting of translucent alumina, having a crystal grain size of not more than 10 μm, and having a thickness of not more than 0.4 mm;
leads extending out of said semiconductor device to be interposed between said base and said cap and electrically connected to said semiconductor element;
low-melting glass for integrally and hermetically sealing said base, said leads, and said cap; and
refractory glass stacked between said base and said low-melting glass.

3. A semiconductor device comprising:
a semiconductor element;
a flat shaped base on which said semiconductor element is mounted, and which consists of high-purity alumina and has a thickness of not more than 0.5 mm;
a cap arranged on said base to cover said semiconductor element, consisting of translucent alumina, having a crystal grain size of not more than 10 μm, and having a thickness of not more than 0.4 mm;
leads extending out of said semiconductor device to be interposed between said base and said cap and electrically connected to said semiconductor element;
low-melting glass for integrally and hermetically sealing said base, said leads, and said cap; and
an Al deposition film formed on the sealing surface of said base contacting said low-melting glass.

4. A device according to claim 2, wherein the thickness of a package body is not more than 1.3 mm.

5. A device according to claim 3, wherein the thickness of a package body is not more than 1.3 mm and further comprising refractory glass stacked between said low-melting glass and said cap.

6. A device according to claim 1, wherein the thickness of a package body is not more than 1.3 mm and further comprising refractory glass stacked between said low-melting glass and said cap.

7. A device according to claim 1, wherein said leads are formed in a gull-wing form.

* * * * *